United States Patent
Guenzel

(10) Patent No.: US 6,205,948 B1
(45) Date of Patent: Mar. 27, 2001

(54) MODULATOR FOR PLASMA-IMMERSION ION IMPLANTATION

(75) Inventor: Reinhard Guenzel, Dresden (DE)

(73) Assignee: Forschungszentrum Rossendorf e.V., Schoenfeld-Wessig (DE)

( * ) Notice: Subject to any disclaimer, the term of this patent is extended or adjusted under 35 U.S.C. 154(b) by 0 days.

(21) Appl. No.: 09/242,546

(22) PCT Filed: Jan. 17, 1998

(86) PCT No.: PCT/DE98/00144

§ 371 Date: May 3, 1999

§ 102(e) Date: May 3, 1999

(87) PCT Pub. No.: WO98/33200

PCT Pub. Date: Jul. 30, 1998

(30) Foreign Application Priority Data

Jan. 23, 1997 (DE) .............................. 197 02 294

(51) Int. Cl.$^7$ .............................. C23C 16/00; H05H 1/00; H01J 1/00

(52) U.S. Cl. ................... 118/723 E; 118/723 I; 156/345; 315/111.21

(58) Field of Search ............. 118/723 E, 723 I, 118/723 ME; 156/345; 315/111.01, 111.21, 111.51, 111.81; 204/798.05, 798.04, 798.17, 798.18

(56) References Cited

U.S. PATENT DOCUMENTS

| | | | |
|---|---|---|---|
| 5,654,043 | * | 8/1997 | Shao et al. ................. 118/723 E |
| 5,698,062 | * | 12/1997 | Sakamoto et al. ............. 156/345 |
| 5,911,832 | * | 6/1999 | Denholm et al. ............. 118/723 E |
| 6,050,217 | * | 4/2000 | Li ........................... 118/723 E |
| 6,050,218 | * | 4/2000 | Chen et al. ................ 118/723 E |

FOREIGN PATENT DOCUMENTS

0596496 * 5/1994 (EP) .................. H01J/37/32

OTHER PUBLICATIONS

Deb, et al. "Beam Switch tube modulaor technology for plasma ion implantation broad industrial applications" Digest of Technical Papers. Ninth IEEE International Pulsed Power Conference (Cat. No. 93CH3350–6), 1993.*

Adler, et al. "Thyratron modulatos in plasma source ion implantation" Digest of Technical Papers. Ninth IEEE International Pulsed Power Conference (Cat. No. 93CH35833), 1995.*

Goebel "Higher power modulator for plasma ion implantation" Journal of Vacuum Science and Technology, part B., 12 (1994) Mar./Apr., No. 2.*

Conrad, et al. "Plasma source ion–immersion technique for surface modification of materials" Journal of Applied Physics, 62 (1987) Dec., No. 11.*

* cited by examiner

Primary Examiner—Gregory Mills
Assistant Examiner—P. Hassanzadeh
(74) Attorney, Agent, or Firm—Jordan and Hamburg LLP

(57) ABSTRACT

A modulator for regulating high voltage pulsed plasma-immersion ion implantation (PIII) acting as a substantial component in a PIII installation is provided. The modulator enables low-cost, easy connection and disconnection of a flow of large high voltage pulsed currents during PIII. In the modulator, pulse regulation occurs by means of an additional electrode which is controlled by a shielding grid as opposed to a high voltage switch mounted as a technically autonomous unit. The electrode and shielding grid are integrated into the implantation chamber and connected to a capacitor to provide high voltage. The shielding grid is triggered by a pulse generator with voltage pulses of 1–2000 V. The shielding grid surrounding the electrode is immersed in plasma and ensures that the additional electrode is either insulated from the plasma or in electric contact therewith by applying controllable grid voltages. In the latter case, the discharge current circuit of the capacitor is closed in a manner similar to that of a switch as in known modulators.

15 Claims, 1 Drawing Sheet

MODULATOR FOR PLASMA-IMMERSION ION IMPLANTATION

BACKGROUND OF THE INVENTION

The present invention relates to a modulator for use in plasma immersion ion implantation (PIII), such a modulator being an essential component for a PIII installation.

For PIII, a workpiece which is to be implanted is immersed in plasma within an implantation chamber. By applying a high negative voltage to the workpiece, positive ions are accelerated out of the plasma onto the workpiece and implanted in the latter. (J. R. Conrad, J. L. Radtke, R. A. Dodd, F. J. Worzala and Ngoc C. Tran, Plasma source ion implantation technique for surface modification of materials, Journal of Applied Physics, 62 1987, 4591–4596). The current density of the implanted ions depends on the plasma parameters and on the implantation voltage selected and is of the order of 1–10 mA/cm$^2$ during the implantation. At an acceleration voltage of 50 kV, the energy input ranges therefore up to 500 W/cm$^2$. Since this energy input would lead to strong heating of the workpiece after a few seconds, the high negative voltage is pulsed and not applied continuously to the workpiece.

A further reason for pulsing the high voltage is the fact that the current required for larger workpieces can be maintained over a prolonged period of time only with appreciable technical effort. The pulse duration is between 2 and 100 $\mu$s at a repetition frequency of a few Hz up to kHz.

Accordingly, an important component of a PIII installation is the so-called modulator which modulates or regulates the appropriate high voltage pulses from a source of rectified high voltage to the workpiece which is to be implanted.

The construction and mode of functioning of the modulators used until now for a PIII installation are always similar. The positive electrode of a high voltage generator is connected via a resistor to a capacitor, the second terminal of which is connected via a high voltage lead-through to the processing table, which is situated within the implantation chamber and carries the workpiece that is to be implanted. The other electrode of the high voltage generator is connected as ground potential 0 to the implantation chamber. Moreover, a switch is disposed at a connection point between the resistor and the capacitor and enables the ground potential to be connected to this pole of the capacitor. The switch controls the charge/discharge of the capacitor, and through the switch, the high voltage pulsing is applied to the workpiece. Since this switch must be able to switch high voltages of several 10 keV at, in some cases, appreciably high currents, switches, which are commercially available at the present time and meet the requirements of PIII, also represent an appreciable cost factor. For smaller installations, especially those designed for research purposes, relatively inexpensive switches, based on semiconductors, can still be used. With these switches, implantation voltages up to 40 kV and currents up to the ampere range can be switched. If larger currents are to be switched, expensive transmitting tubes, which are attainable, for example, for voltages up to 40 kV and currents up to 200 ampere, must be used. Still higher currents up to 1 kA can be switched with the so-called "Crossatrons" (D. M. Goebel, High power modulator for PII, J. Vac. Sci. Technol. B. Vol. 12, 2, 1994, 838–842).

A further increase in the currents to be connected is possible only with extremely expensive custom-made products, such as those known from fusion research (B. J. Wood, J. T. Scheuer, M. A. Nastasi, R. H. Olsher, W. A. Reass, I. Henins and D. J. Rej, Design of a large-scale plasma source ion implantation experiment, Materials Research Society Symposium Proceedings, V 279, 1993, Materials Research Society, Pittsburgh, Pa., USA, 345–350).

OBJECTS AND SUMMARY OF THE INVENTION

It is an object of the invention to switch the large currents which flow during the action of the high voltage pulse in PIII installations on and off under high voltage with little technical and financial effort.

It is another object of the invention to provide a new and improved plasma immersion ion implantation method and apparatus.

Pursuant to the invention, these objectives are accomplished by the presence of a modulator, which, instead of being made available as a technically independent unit as are the switches in the prior art described above, is integrated in an implantation chamber in the form of an additional electrode and which can be controlled using a shielding grid.

A shielding grid surrounds the electrode arranged in the implantation chamber and by applying controllable grid voltages, the shielding grid ensures that the additional electrode either is insulated from the plasma or is in electrical contact with the plasma. In the latter case, as in the case when the switch in the modulator described above is closed, the discharging circuit of the capacitor is closed.

BRIEF DESCRIPTION OF THE DRAWINGS

The foregoing and other features and advantages of the present invention will become apparent to one skilled in the art to which the invention relates upon consideration of the following detailed description of the preferred embodiments with reference to the accompanying drawings wherein.

DETAILED DESCRIPTION

Figure 1:
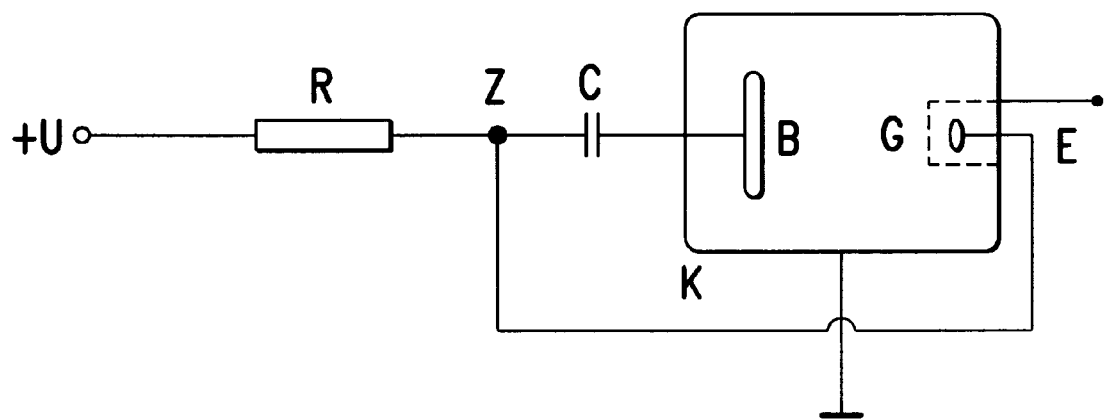
FIG. 1 is a schematic illustration of a plasma immersion ion implantation apparatus including a modulator in accordance with the invention.

Referring to FIG. 1, a positive pole of a high voltage generator, labeled +U, is connected via a resistor R to a capacitor C, a second pole of which is connected via a high voltage lead-through to a processing table B within an implantation chamber K. The implantation chamber itself, as also the second pole of the high voltage generator, is at ground potential. A connection point Z lies between resistor R and capacitor C and, in turn, is connected via high voltage lead-through to the additional electrode E within the implantation chamber K. This electrode is shielded from the plasma by shielding means such as a grid G which can be acted upon with a negative control voltage UG. So as not to interfere with the spread of the plasma edge layer, the electrode E and the grid G surrounding the electrode E are disposed in the implantation chamber K at a sufficient distance from the material being treated and insulated from the implantation chamber K.

Figure 2:
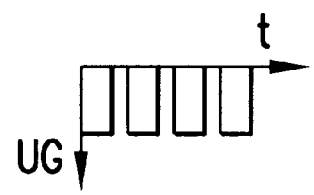
FIG. 2 is a time graph of an exemplary control voltage for use in the modulator shown in FIG. 1.

FIG. 2 is a graph of the negative control voltage UG applied to the grid G as a function of time t.

The modulator functions as follows.

If there is an electrically conductive plasma in the implantation chamber K, the second connection of the capacitor, which is connected to the processing table, is also held by the plasma at the potential of the implantation chamber K (ground potential). That is, the capacitor is charged by the high voltage source as long as the electrode E is insulated from the plasma by means of the negative grid voltage UG applied to the grid G.

The electrode E is insulated electrically from the plasma in the following manner. The negative grid voltage of the shielding grid is fixed as a function of the temperature of the electrons and of the mesh width of the shielding grid so that the thermal electrons of the plasma cannot pass through the shielding grid. For this purpose, a value 10 to 100 times the temperature of the electrons is required. The positive ions of the plasma, which can pass through the negatively charged grid cannot, in turn, overcome the positive potential (+U) of the electrode E, so that, at a negative grid voltage UG, the electrode E is insulated electrically from the plasma.

If the grid voltage UG=0 is applied to the grid G, electrons can pass out of the plasma through the grid and are accelerated by the positive potential of the electrode E onto this electrode. This acceleration will take place as long as the electrode E is charged positively with respect to the plasma (a few volts). Since the electrode E and also the connection Z of the capacitor C are set practically to ground potential by these means, the electrode of the capacitor C, which is connected to the processing table B, and also the processing table B, now change in potential to −U producing a high voltage pulse. The high voltage generator is now connected to ground via the adequately rated resistor R.

Since the processing table B and material which is on this table and is to be treated are now at a negative potential with respect to the surrounding plasma, positively charged ions are accelerated from the plasma in the direction of the processing table B. As a result of the velocity resulting from the potential difference between the plasma and the processing table B, the ions are implanted into the material that is to be treated.

Further, the discharging circuit of the capacitor C is also closed, since the positively charged ions reach the processing table and the material to be treated and the electrons are accelerated towards electrode E. By applying the negative grid voltage UG to the shielding grid of the electrode E, the electrode E is insulated electrically once again from the plasma in the manner described above, as a result of which the discharging process of the capacitor is interrupted. The processing table is held once again at the plasma potential by the plasma. The implantation process is concluded and the capacitor is charged once again.

The duration and the repetition rate of such an implantation cycle are variable. The discharging times of the capacitor C and, with that, the implantation times usually range from a few $\mu$s up to 100 $\mu$s while the repetition rates range up to several kHz. The capacity of the capacitor C is such that, during the discharging process, the capacitor is discharged only partially.

If the number of electrons extracted during the discharging phase of the capacitor C from the plasma is equal to the number of ions implanted, the charge carrier balance of the plasma is not affected. However, when ions strike the material to be treated, secondary electrons are also released which, in the event that secondary electron suppression is not provided, are accelerated away from the material being treated to the chamber wall because of the given potential difference. As a result, an additional electron current equal to the secondary electron current must be withdrawn from the plasma by the electrode E. However, the charge carrier balance of the plasma also equalizes itself here, since there is a shift of the plasma potential to positive values, as a result of which the flow of the thermal electrons of the plasma to the chamber wall is correspondingly decreased. This equalization is also supported by the electrons released there as the secondary electrons strike the chamber wall. The magnitude of the current formed by the accelerated ions and electrons depends on the plasma parameters and on the potential difference between the processing table and the plasma. Usually, current densities of about 0.1 to 1 A/cm$^2$ occur and are at their highest value at the start of a pulse. After several $\mu$s, the current density falls off to a stationary value.

If larger goods with a surface area of about 1 m$^2$, which are more relevant to those encountered in practice, are to be processed, a current of up to 10 kA results in the pulse. The functioning of the modulator, described above, is ensured as long as the flow of electrons, which is to be extracted during the implantation phase in the pulse from the electrode E, is smaller than the flow of thermal electrons of the plasma striking the chamber wall. This is always the case with The advantages of the invention lie in the appreciable savings in costs, particularly when larger workpiece surfaces are to be treated by PIII. For example, when electron tubes are used, expensive and costly cathode heating is required. A simple replacement of worn components (grid) is also possible with the invention presented.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

What is claim is:

1. A modulator for controlling high voltage, pulsed plasma immersion ion implantation in which a processing table is disposed within an implantation chamber and is connected via a capacitor and a resistor to a high voltage source, the capacitor having a first pole coupled to the processing, table and a second pole, the modulator comprising:

an electrode exposed in the implantation chamber and connected to the second pole of the capacitor;

a grid for shielding said electrode from plasma in the implantation chamber; and a pulse generator connected to said grid for generating negative voltage pulses which isolate said electrode from electron conduction with the plasma when present and whereby conduction between the electrode with the plasma occurs when the negative voltage pulses are not present.

2. The modulator of claim 1, wherein said grid is structured and arranged to be acted upon by a negative control voltage.

3. The modulator of claim 2, wherein said grid is interposed between the plasma in the implantation chamber and said electrode such that when said grid is acted upon by the negative control voltage, said electrode is electrically insulated from the plasma.

4. The modulator of claim 1, wherein said electrode and said grid are arranged at a sufficient distance from the processing table to avoid interference with spread of a plasma edge layer created during ion implantation.

5. The modulator of claim 1, wherein the pulse generator generates the negative voltage pulses in a range of from 1 V to 2000 V.

6. A plasma immersion ion implantation system, comprising an implantation chamber defining a chamber interior receivable of ion plasma and at least one workpiece for ion treatment;

a support arranged in said chamber interior for positioning the at least one workpiece within said chamber interior such that an implantation surface of the at least one workpiece is exposed to ion plasma;

a voltage generator in electrical communication via a resistor and a capacitor with said support for applying electrical pulses for attracting ions to said support, said capacitor having a first pole coupled to said support and a second pole; and a modulator for modulating the electrical pulses applied to said support, said modulator comprising:

an electrode arranged in said chamber interior and electrically coupled to said second pole of said capacitor;

shielding means for shielding said electrode from the ion plasma in said chamber interior; and a pulse generator connected to said shielding means for generating negative voltage pulses which isolate said electrode from electron conduction with the plasma when present and whereby conduction between the electrode with the plasma occurs when the negative voltage pulses are not present.

7. The plasma immersion ion implantation system of claim 6, wherein said shielding means comprise a grid.

8. The plasma immersion ion implantation system of claim 7, wherein said grid is structured and arranged to be acted upon by a negative control voltage.

9. The plasma immersion ion implantation system of claim 8, wherein when said grid is interposed between the plasma in the implantation chamber and said electrode such that when said grid is acted upon by the negative control voltage, said electrode is electrically insulated from the plasma.

10. The plasma immersion ion implantation system of claim 6, wherein said electrode and said shielding means are arranged at a sufficient distance from said support to avoid interference with spread of a plasma edge layer created during ion implantation.

11. The plasma immersion ion implantation system of claim 6, wherein said support comprises a processing table.

12. The plasma immersion ion implantation system of claim 6, wherein the pulse generator generates the negative voltage pulses in a range of from 1 V to 2000 V.

13. A method for implanting plasma ions into a workpiece, comprising the steps of:

arranging the workpiece on a support in an interior of a plasma-containing implantation chamber;

electrically coupling the support to a high voltage source via a resistor and a capacitor, the capacitor having a first pole coupled to the support; and modulating the flow of high voltage from the high voltage source to the support by:

exposing an electrode in the implantation chamber;

electrically connecting the electrode to the second pole of the capacitor;

arranging a grid around the electrode;

connecting a pulse generator capable of generating negative voltage pulses to the grid such that when the negative voltage pulses are applied to the grid, the electrode is shielded from conduction with plasma in the implantation chamber; and controlling the pulse generator such that the electrode is alternatingly shielded from conduction with the plasma when negative voltage is applied to the grid by the pulse generator or in electrical contact with the plasma when the negative voltage is not applied to the grid by the pulse generator.

14. The method of claim 13, further comprising the step of fixing the negative voltage of the grid as a function of the temperature of electrons and a mesh width of the grid.

15. The method of claim 13, further comprising the step of arranging the electrode and grid at a sufficient distance from the support to avoid interference with spread of a plasma edge layer created during ion implantation.

\* \* \* \* \*